United States Patent [19]
Keller et al.

[11] Patent Number: 5,587,045
[45] Date of Patent: Dec. 24, 1996

[54] GETTERING OF PARTICLES FROM AN ELECTRO-NEGATIVE PLASMA WITH INSULATING CHUCK

[75] Inventors: John H. Keller, Newburgh; Gregory Costrini, Hopewell Junction, both of N.Y.

[73] Assignee: International Business Machines Corporation, Armonk, N.Y.

[21] Appl. No.: 430,040

[22] Filed: Apr. 27, 1995

[51] Int. Cl.$^6$ .................................................. H01L 21/306
[52] U.S. Cl. ............................ 156/627.1; 118/723 E; 118/723 ER; 156/345
[58] Field of Search .................. 156/345, 626.1, 156/627.1; 118/723 E, 723 ER; 204/298.09, 298.34

[56] References Cited

U.S. PATENT DOCUMENTS

| | | | |
|---|---|---|---|
| 4,222,838 | 9/1980 | Bhagat et al. ..................... | 204/192 E |
| 5,102,496 | 4/1992 | Savas ................................. | 156/643 |
| 5,147,493 | 9/1992 | Nishimura et al. ................ | 156/345 |
| 5,203,945 | 4/1993 | Hasegawa et al. ................ | 156/345 |
| 5,273,610 | 12/1993 | Thomas, III et al. ............ | 156/345 |
| 5,332,441 | 7/1994 | Barnes et al. ..................... | 118/723 |
| 5,414,324 | 5/1995 | Roth et al. ........................ | 315/111.21 |
| 5,433,813 | 7/1995 | Kuwabara .......................... | 156/345 |
| 5,460,684 | 10/1995 | Saeki et al. ....................... | 156/345 |

*Primary Examiner*—R. Bruce Breneman
*Assistant Examiner*—Joni Y. Chang
*Attorney, Agent, or Firm*—Whitham, Curtis, Whitham & McGinn; Alison Mortinger

[57] ABSTRACT

Apparatus controls a wafer potential in a plasma system when the plasma is off to keep the wafer slightly negative at all times in order to reduce and eliminate the collection of charged particles on the wafer. The apparatus allows the wafer bias to be reduced to a small negative voltage and then holds that voltage. This greatly reduces the net positive flux to the wafer. A diode and a programmed power supply hold a minimum negative voltage on the back of the wafer electrode when the plasma density is decaying to zero.

5 Claims, 10 Drawing Sheets

GETTERING OF PARTICLES FROM AN ELECTRO-NEGATIVE PLASMA WITH INSULATING CHUCK

BACKGROUND OF THE INVENTION

1. Field of the Invention

The present invention generally relates to a way of preventing particles in a plasma from going to a wafer in semiconductor manufacturing processes and, more particularly, to an effective control of the actual wafer potential in a plasma system when it is turned off to keep it slightly negative at all times and thereby reduce and eliminate collection of charged particulates on the wafer.

2. Background Description

In the manufacture of integrated circuits (ICs), semiconductor wafers are subjected to several processes, some of which involve a plasma. Radio frequency (RF) and direct current (DC) glow discharge plasmas, for example, are extensively utilized in the manufacture of ICs. Both electropositive and electronegative gases are used to produce plasmas. Electronegative gases, defined as those having a higher ion density than electron density, such as $CF_4$, $CHF_3$, $C_{12}$, HBr or $O_2$, present difficult contamination problems for semiconductor manufacture. Contaminating particles ranging from tenths of microns to microns are produced or grown in the plasmas. The particles normally have a negative charge. Increasing densities of semiconductor circuits make contamination a serious problem to product reliability and may even be a barrier to achieving theoretically possible higher density circuits.

U.S. Pat. No. 5,332,441 to Barnes et al. and assigned to the assignee of this application discloses an apparatus for plasma processing involving the gettering of particles having a high charge to mass ratio away from the wafer. Magnets are used to produce a magnetic field which is transverse to an electric field to draw the negative particles away from the wafer. In addition, a power source is connected to the wafer electrode to maintain a negative charge on the wafer to thereby prevent negative particles from being drawn to the wafer surface when the plasma is turned off. Barnes et al. demonstrated that if the wafer could be kept negative while the plasma was turned off, then the particles in the plasma can be prevented from going to the wafer. However, if a fixed voltage is used, this solution has problems when an insulator is used between the wafer and the wafer electrode. This is the normal case, however, in most systems with a mechanical chuck and in all cases where "electrostatic chucks" are used. These problems are that either a large voltage is used which pulls a large positive charge to the wafer, causing possible breakdown of oxides on the wafer or the insulating layer charges up and allows the wafer to charge to a positive voltage thus attracting the negatively charged particulates in the plasma.

SUMMARY OF THE INVENTION

It is therefore an object of the present invention to provide a means to control the wafer potential in a plasma system when the plasma is off to keep the wafer slightly negative at all times in order to reduce and eliminate the collection of charged particles on the wafer.

According to the invention, there is provided an apparatus that allows the wafer bias to be reduced to a small negative voltage and then holds that voltage. This greatly reduces the net positive flux to the wafer. The invention uses a diode and a programmed power supply to hold a minimum negative voltage on the back of the wafer electrode when the plasma density is decaying to zero.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
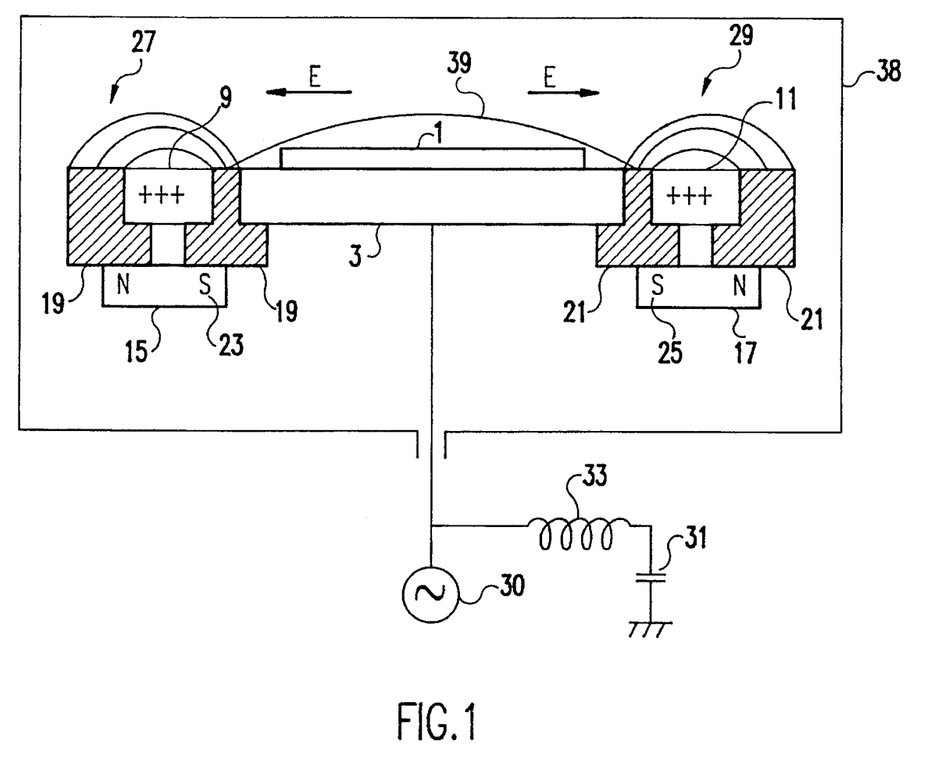
FIG. 1 is a cross-sectional side view and schematic diagram of the basic particle gettering apparatus.

Referring now to the drawings, and more particularly to FIG. 1, there is shown a gettering apparatus in which a wafer 1 is loaded on a wafer electrode 3, located between a set of parallel positive electrodes 9 and 11 in a chamber 38. The wafer electrode 3 is insulated from the positive electrodes 9 and 11 by insulators 19 and 21. A set of magnets or magnet coils 15 and 17 is located below the positive electrodes 9 and 11, respectively. Arc shaped magnetic fields 27 and 29 are generated by magnets 15 and 17. The magnetic fields 27 and 29 are nearly transverse to the electric field E. Typically, magnetic fields which are over 75 Gauss/cm are sufficient to prevent high energy electrons from being drawn toward the positive electrodes, thereby preventing formation of a normal plasma sheath 39. A negative bias is applied to the wafer electrode 3 at the time the plasma is terminated. A capacitor 31 is connected to the negative electrode 3 on which the wafer 1 rests through a choke coil 33. When the power 30 is turned off, the stored negative charge in the capacitor 31 biases the electrode 3 negative.

Figure 2:
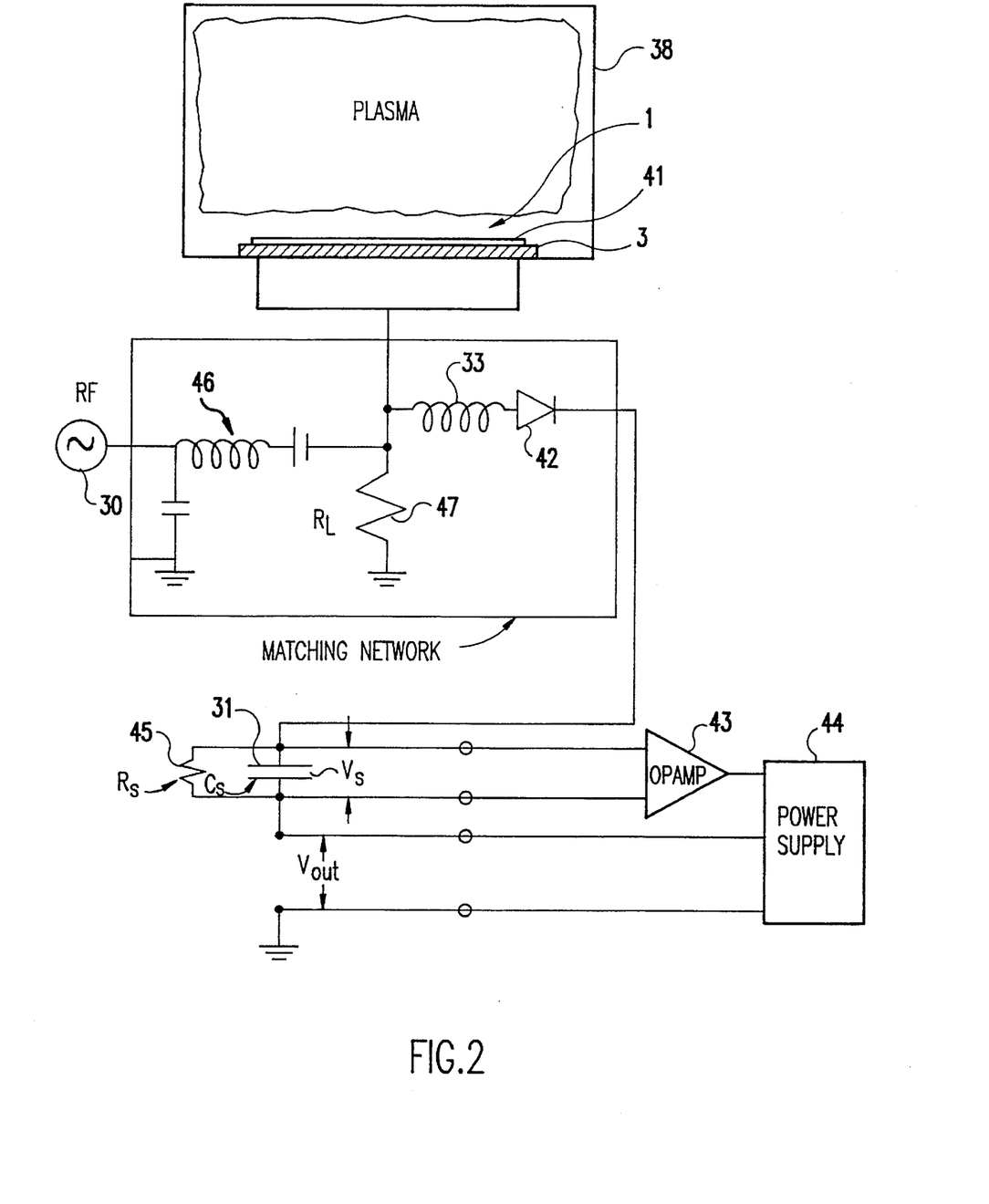
FIG. 2 is a schematic and block diagram of the improved particle gettering apparatus according to the present invention.

As mentioned, this basic apparatus has two problems. Either a large voltage is used which pulls a large positive charge on the wafer 1 or the insulating layer charges up and allows the wafer to charge positive. The apparatus according to the present invention solves those problems. FIG. 2 is diagram of the system according to the present invention wherein like reference numerals indicate the same or equivalent structure as shown in FIG. 1. For this embodiment, the magnetic field structure is not used. In FIG. 2, it will be observed that the wafer 1 is separated from the electrode 3 by an insulating layer 41, which may be an electrostatic chuck. If the insulator 41 is approximately 1 mil or more, then any capacitance or fixed negative voltage smaller than the bias voltage applied to the wafer electrode will not prevent the wafer from going positive. The capacitance of the wafer 1, layer 41 and electrode 3 is approximately 20,000 pf.

In the apparatus according to the present invention, a diode 42 is inserted between the choke 33 and the capacitor 31, which acts as a sensing device. The voltage across the capacitor 31 is applied to an operational amplifier 43, the output of which is connected to a control input of a power supply 44. The current from the diode 41 feeds through capacitor 31 whose value can be equal to or larger than the capacitance formed by the insulating layer 41 under the wafer 1. A resistor 45 may be used in parallel with the capacitor 31 such that the RC time constant is large compared to the plasma decay time. In addition, a matching network 46 is shown connecting the RF power 30 to the electrode 3. This matching network is shown as including a leakage resistance 47, $R_L$, of approximately 10 Megohms (M$\Omega$).

The voltage, $V_s$, across the capacitor 31 is fed into operational amplifier 43, with a gain such that its output can be fed into the control of power supply 44, or its output can be used directly, to produce a voltage V1(t) on electrode 3 which is proportional the integral of the current passing through the diode 42 and is approximately proportional to the integral of the net current which is flowing to the wafer 1. V1(t) is $-(G-1)$ times $V_s$, where G is the gain of the operational amplifier/power supply combination or, where the output of the operational amplifier is used directly, the gain of the operational amplifier. The voltage on electrode 3 is thus V(t)=−Vo+V1(t) when the plasma density is decaying during the afterglow. By adjusting the proportionality constant, V1(t) can be made equal to the negative of the voltage across the wafer insulating layer 41, the wafer 1 will thus remain at −Vo while the plasma is decaying. This wafer electrode voltage will then rise to −Vo in a time which is long compared to the decay time of the plasma. Since during this longer time, there is no longer any current flowing to the wafer, the wafer will remain at −Vo.

If it is found advantageous, the proportionality constant can be increased or Vo can be increased such that in the weak plasma during the plasma decay, the thickness of the plasma sheath will increase, thus giving the negatively charged particulates, which are located at the plasma side of the sheath, an impulse away from the wafer when the plasma is turned off.

Figure 3:
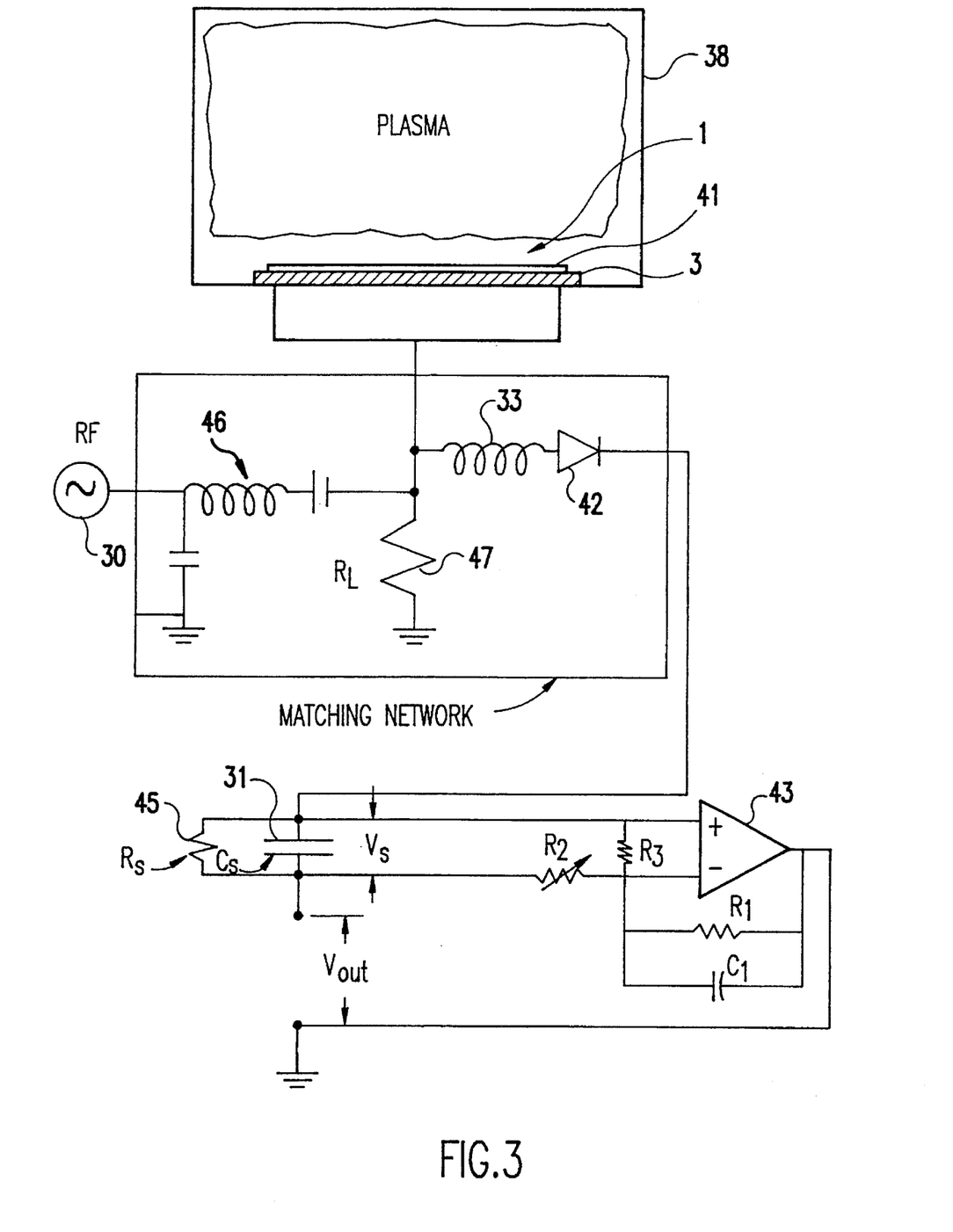
FIG. 3 is a schematic and block diagram of an alternative embodiment of the improved particle gettering apparatus according to the invention.

As mentioned above, it is also possible to omit the power supply 44 and generate the voltage which is added to the capacitor voltage directly from the operational amplifier 43. This arrangement is shown in FIG. 3. In this case, the operational amplifier 43 needs to be a high voltage operational amplifier run in its non-inverting mode.

Figure 4:
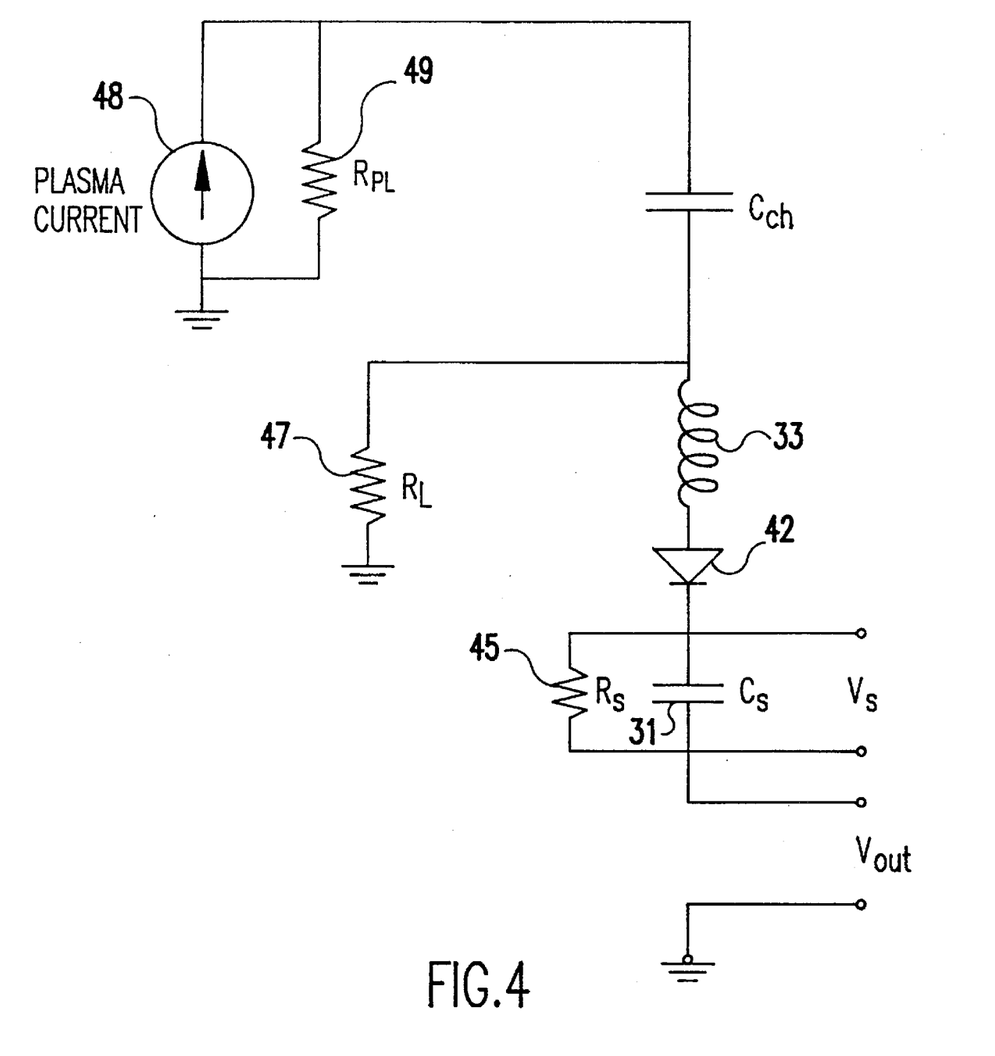
FIG. 4 is an equivalent circuit diagram of the apparatus shown in FIGS. 2 and 3.

FIG. 4 is the equivalent circuit diagram of the apparatus shown in FIGS. 2 and 3 wherein the plasma is represented by a source of plasma current 48 and a plasma current source resistance 49, $R_{PL}$, approximately equal to 10 M$\Omega$, which feeds leakage resistance 47, $R_L$. The capacitor, $C_{ch}$, is the capacitance of the electrostatic chuck holding the wafer.

Since systems with loop gains greater than one can be unstable, the following is an analysis of the stability criteria. In this equivalent circuit, $$\frac{dV_s}{dt} = I(t) + \frac{GV_s - V_s}{R_p} - \frac{V_{ch}}{R_{PL}} - \frac{V_s}{R_s},$$

where Vout is $GV_s$ based on an operational amplifier gain of G, and $$R_p = \frac{(R_{PL} \times R_L)}{(R_{PL} + R_L)}.$$

For stability, we want $$\frac{dV_s}{dt} \leq 0$$

when I(t)=0. Therefore, $$0 \geq \frac{(G-1)V_s}{R_p} - \frac{V_{ch}}{R_{PL}} - \frac{V_s}{R_s},$$

or even more restrictively, $$0 \geq \frac{(G-1)}{R_p} - \frac{1}{R_s}.$$

Thus, $R_s$ should be less than or equal to $R_p/(G-1)$. Due to the conductance of the plasma, the value of $R_s$ must be further reduced for stable operation.

Another mode of operation may be implemented in which the operational amplifier 43 output may be allowed to saturate until the plasma conductance is reduced below a certain value. The plasma may also be pulsed on and off many times during the plasma process so that particulates can be gettered from the plasma or prevented from forming during the plasma processing.

Figure 5:
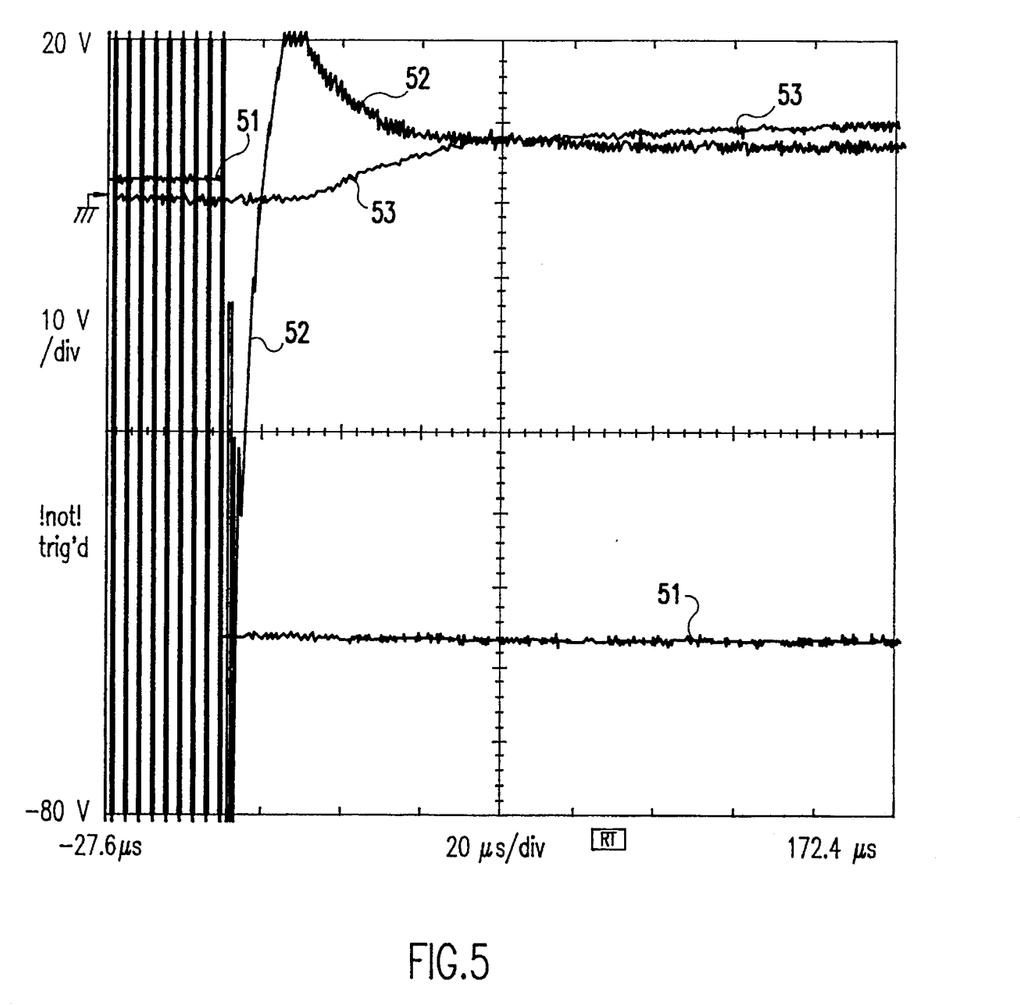
FIG. 5 is graph generated by a storage oscilloscope showing the effect of a fast turn off of the RF without the invention.
Figure 6:
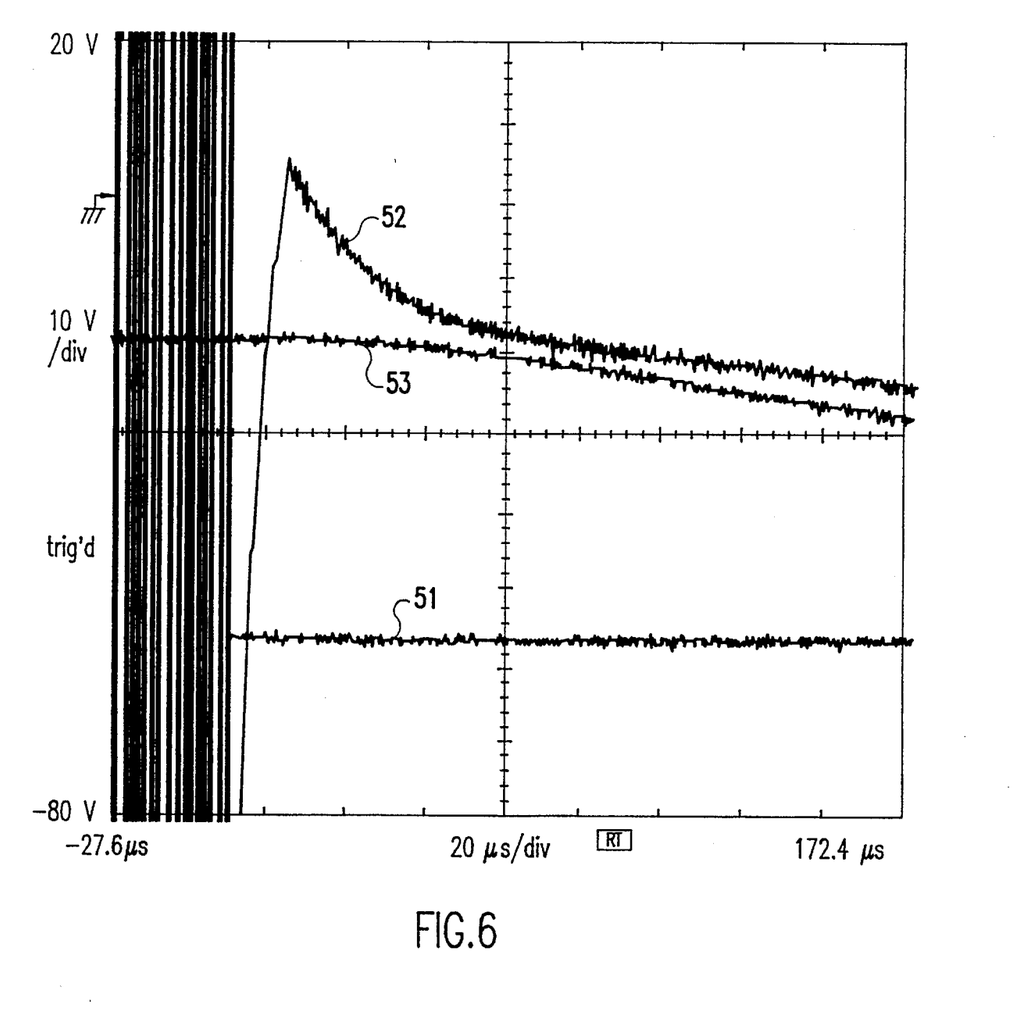
FIG. 6 is a graph generated by a storage oscilloscope showing the effect of a fast turn off of the RF with the invention.

FIG. 5 is a graph generated by a storage oscilloscope showing the effect without the invention of generator turn off faster than desired due to the RF turning off faster than the bias decays. The line 51 is the control the RF generator, and the turn off time is 1 μs. The line 52 is the voltage on the wafer; i.e., the RF plus the bias voltage. The line 53 is the bias voltage of the wafer electrode. Notice that bias voltage goes positive. In contrast, FIG. 6 shows a graph generated under similar circumstances but with the invention. In this case, note that the wafer is driven negative after the electrode bias decays to −10 volts (from approximately 300 volts) and the diode 42 turns on. However, when the plasma is allowed to decay before the wafer is driven negative, that is, the bias voltage is allowed to decay from, say, −300 volts to −10 volts, and the RF turn off is made longer, the ion drag force on the particulates is reduced. The time constant for the decay of the charge on the particulates is also reduced. Thus, when the wafer is driven negative after the plasma is allowed to partially decay in density, it is possible to drive even large particulates away from the wafer when the plasma is turned off.

Figure 7:
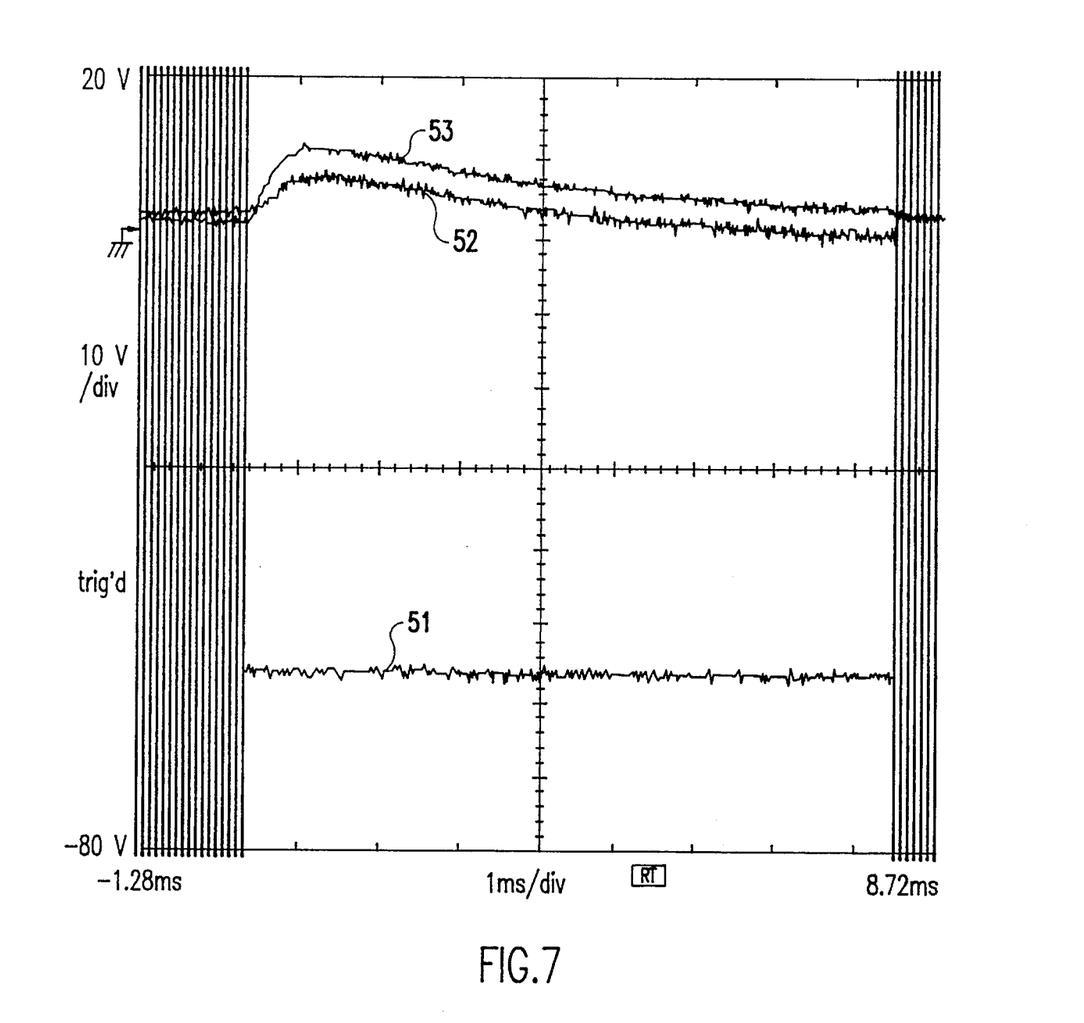
FIG. 7 is a graph generated by a storage oscilloscope showing the effect of a turn off of the RF at about the same time as the plasma without the invention.
Figure 8:
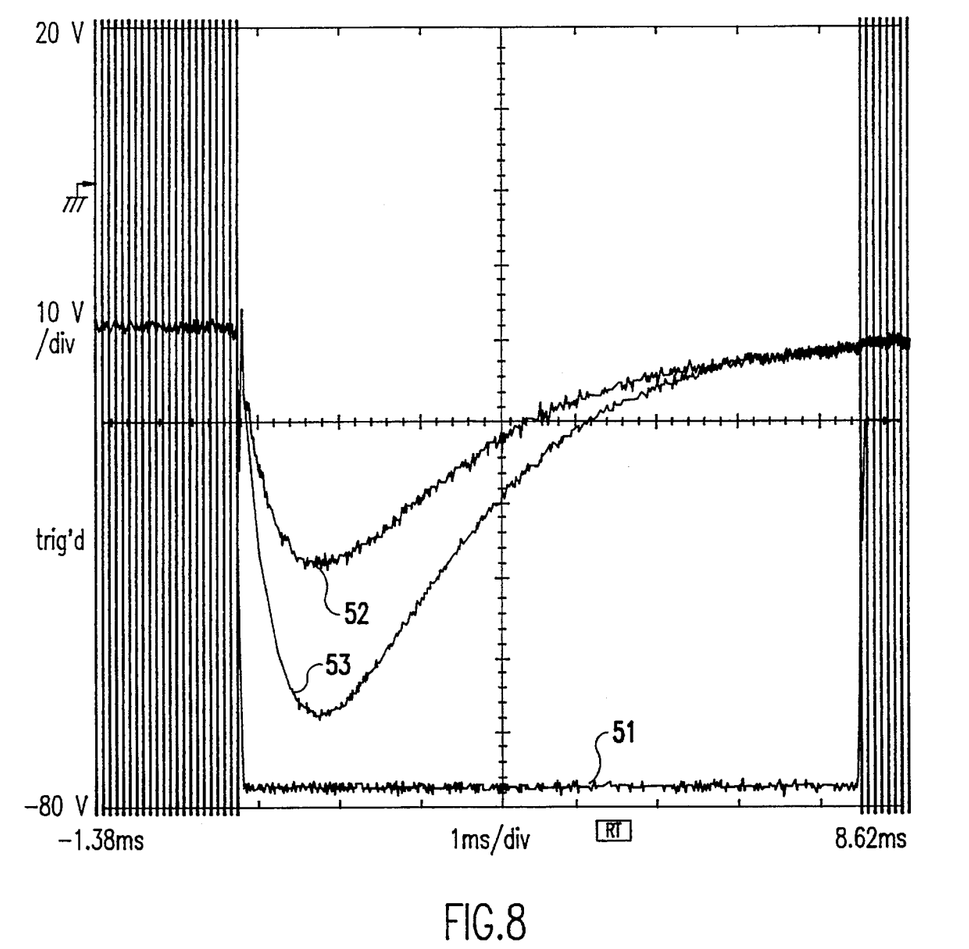
FIG. 8 is a graph generated by a storage oscilloscope showing the effect of a turn off of the RF at about the same time as the plasma with the invention.

FIG. 7 is a graph generated without the invention where the RF turns off at roughly the same time or slower than the plasma. Note under these conditions, the wafer still goes positive. In contrast, FIG. 8 shows a graph generated under similar circumstances but with the invention. In this case, the wafer is driven negative after the bias decays to −10 volts.

Figure 9:
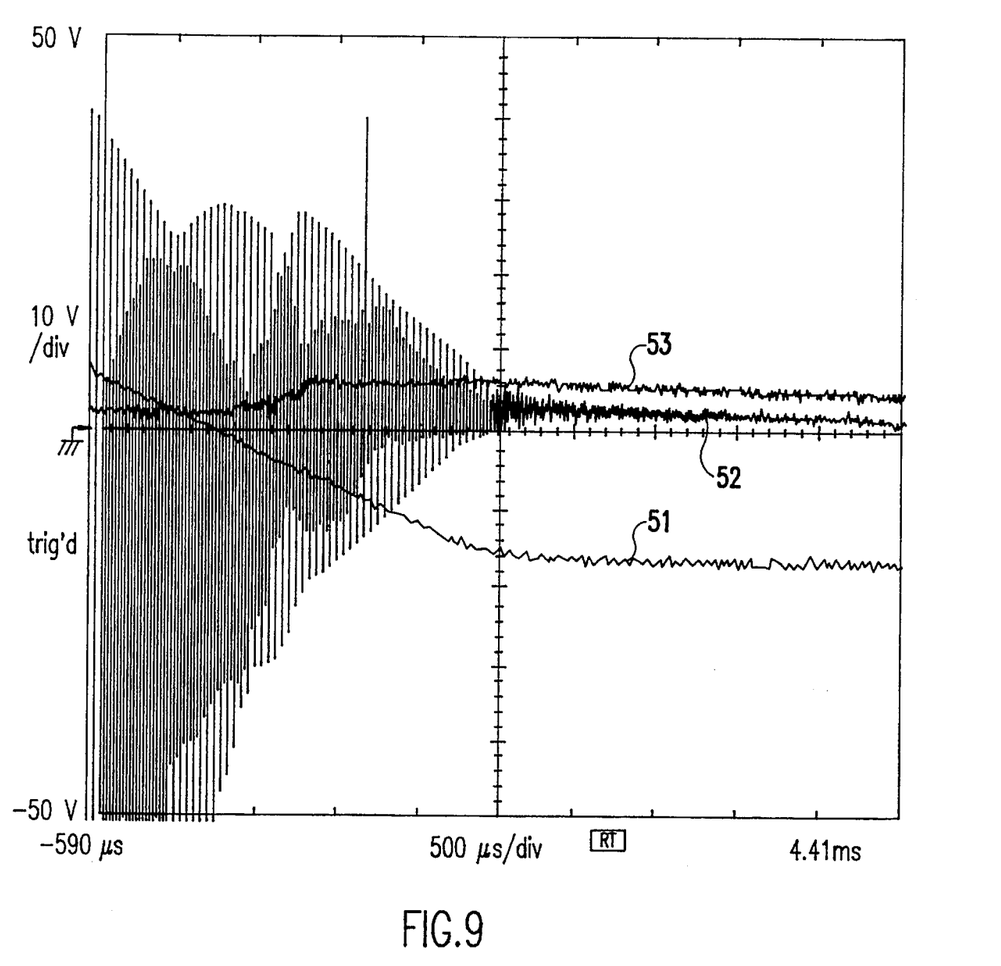
FIG. 9 is a graph generated by a storage oscilloscope showing the effect of RF turn off much longer than bias decay without the invention.
Figure 10:
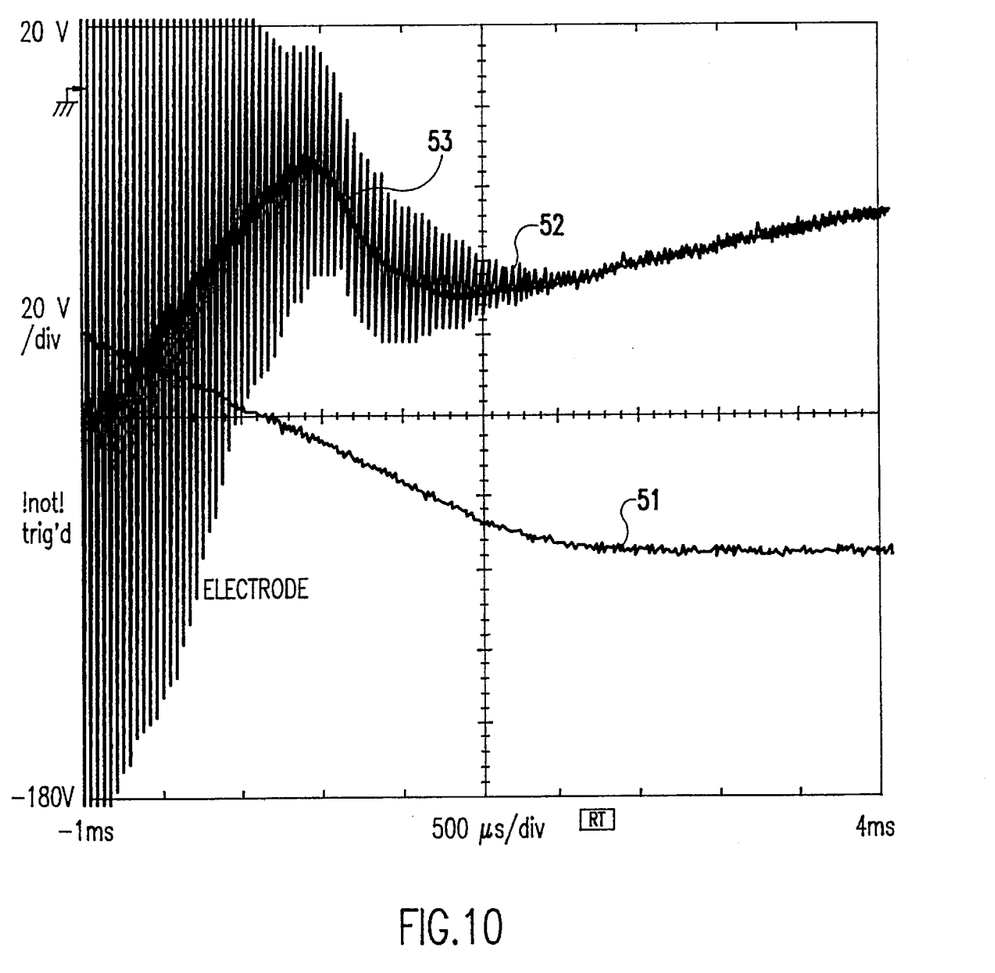
FIG. 10 is a graph generated by a storage oscilloscope showing the effect of RF turn off much longer than bias decay with the invention.

FIG. 9 is a graph generated without the invention where the RF turn off is 5 ms; i.e., much longer than the bias decay. Note, however, that the bias on the wafer still goes positive under these conditions. In contrast, FIG. 10 is a graph generated under similar conditions but with the invention. In this case, the wafer is driven negative after the bias reaches −10 volts.

The data shown in these graphs demonstrates that, under a variety of conditions of RF turn off and bias decay, the invention is effective in maintaining a negative bias on the wafer. This, in turn, is effective in preventing collection of charged particulates on the wafer.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. In a plasma processing system used in the manufacture of semiconductor circuits wherein a semiconductor wafer is mounted on a negative electrode and exposed to a plasma discharge, said wafer being separated from said negative electrode by an insulator, an apparatus for preventing negatively charged particulates from going to the wafer when the plasma discharge is turned off, said apparatus comprising:

a sensing device connected to said negative electrode through a diode and a choke;

a source of voltage between said sensing device and circuit ground; and bias control means connected across said capacitor for controlling said source of voltage to maintain a small negative bias on said wafer when plasma density decays to zero.

2. The apparatus recited in claim 1 wherein said sensing device is a capacitor.

3. The apparatus recited in claim 1 wherein said bias control means is an operational amplifier having inputs connected across said sensing device and generating an output control voltage to control said source of voltage.

4. The apparatus recited in claim 1 wherein said bias control means is a high voltage operational amplifier having inputs connected across said sensing device and generating an output voltage, said output voltage being said source of voltage connected between said sensing device and circuit ground.

5. The apparatus recited in claim 1 wherein said sensing device is a capacitor and said bias control means is an operational amplifier connected across said capacitor, said operational amplifier generating a control voltage for controlling said source of voltage.

* * * * *